(12) United States Patent
Hirose et al.

(10) Patent No.: US 7,700,937 B2
(45) Date of Patent: Apr. 20, 2010

(54) SINGLE-PHOTON GENERATING DEVICE, SINGLE-PHOTON DETECTING DEVICE, AND OPTICAL QUANTUM GATE

(75) Inventors: Shinichi Hirose, Kawasaki (JP); Motomu Takatsu, Kawasaki (JP); Tatsuya Usuki, Kanagawa (JP); Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 81 days.

(21) Appl. No.: 11/522,421

(22) Filed: Sep. 18, 2006

(65) Prior Publication Data

US 2007/0210299 A1   Sep. 13, 2007

(30) Foreign Application Priority Data

Mar. 8, 2006   (JP)   ............................. 2006-063054

(51) Int. Cl.
*H01L 33/00* (2006.01)

(52) U.S. Cl. .............................. 257/13; 257/95; 257/98; 257/E29.322; 977/949; 977/950

(58) Field of Classification Search .................... 257/13
See application file for complete search history.

(56) References Cited

U.S. PATENT DOCUMENTS

| 6,864,501 | B2 * | 3/2005 | Shields et al. ................. 257/13 |
| 7,087,923 | B2 * | 8/2006 | Ward et al. ..................... 257/22 |
| 7,268,371 | B2 * | 9/2007 | Krames et al. ................ 257/98 |

OTHER PUBLICATIONS

Obert et al, phys. stat. sol. (a) 190, No. 2, 357-361 (2002) "Three-Dimensional Optical confinement in II-VI Pillar Microcavities".*
M. Pelton et al., "Efficient Source of Single Photons: A Single Quantum Dot in a Micropost Microcavity," Physical Review Letters, vol. 89, No. 23, Dec. 2, 2002, pp. 233602-1-233602-4.
Z. Yuan et al., "Electrically Driven Single-Photon Source," Science, vol. 295, Jan. 4, 2002, pp. 102-105.

* cited by examiner

*Primary Examiner*—Jerome Jackson, Jr.
(74) *Attorney, Agent, or Firm*—Kratz, Quintos & Hanson, LLP

(57) ABSTRACT

A single-photon generating device is configured to have a solid substrate including abase portion, and a pillar portion which is formed on the surface side of the base portion with a localized level existent in the vicinity of the tip of the base portion. The above pillar portion is formed to have a larger cross section on the base portion side than the cross section on the tip side, so that the light generated from the localized level is reflected on the surface, propagated inside the pillar portion, and output from the back face side of the base portion.

16 Claims, 11 Drawing Sheets

FIG. 3(a)
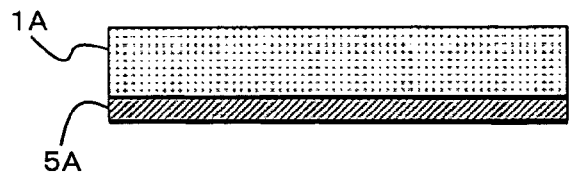
FIG. 3(b)
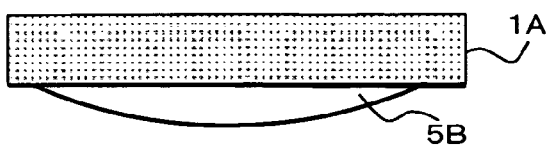
FIG. 3(c)
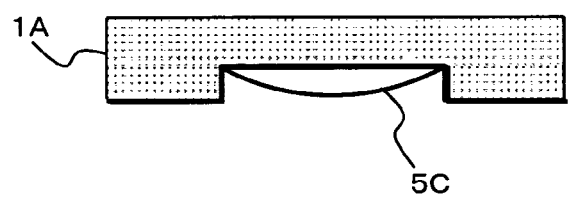
FIG. 3(d)
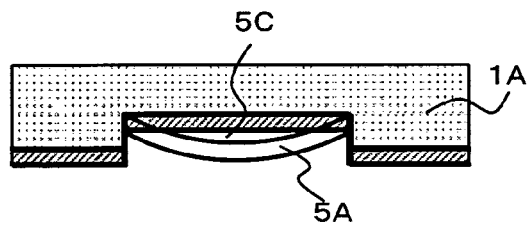
FIG. 3(e)
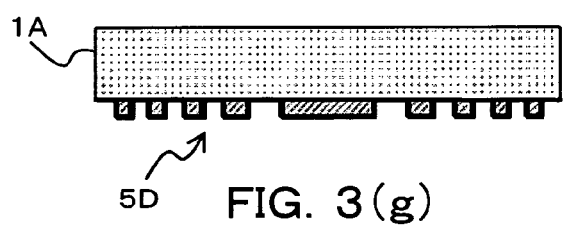
FIG. 3(f)
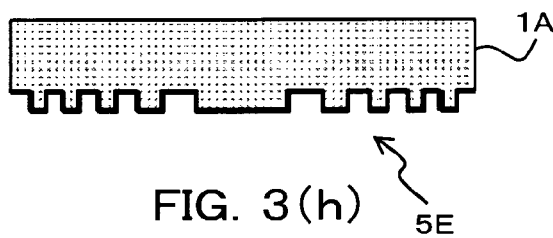
FIG. 3(g)
FIG. 3(h)
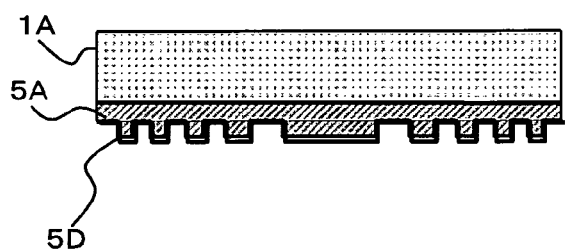
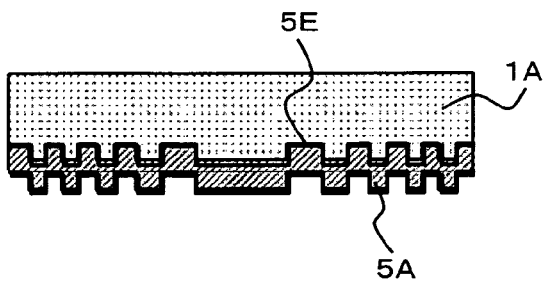

FIG. 5(a)
FIG. 5(b)
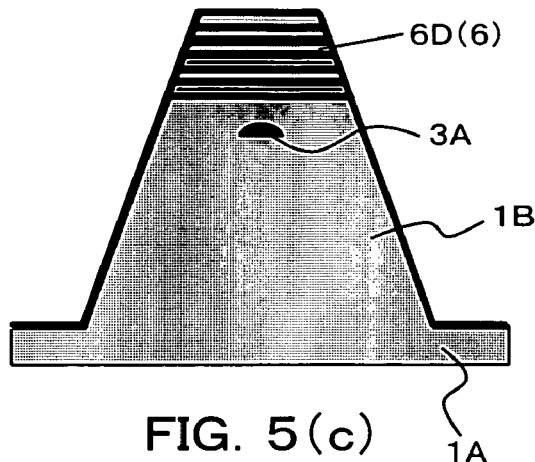
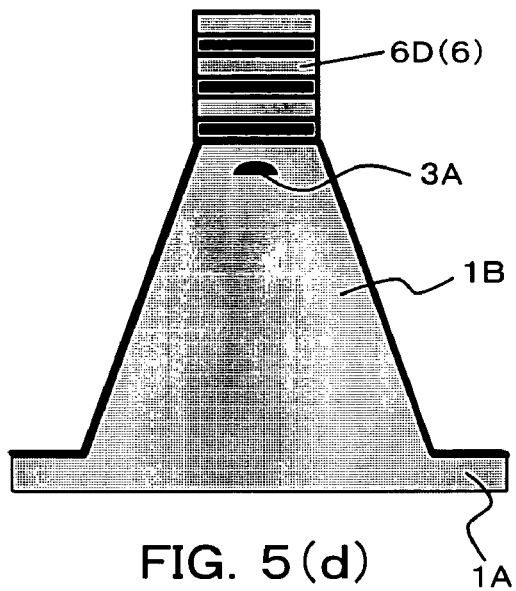
FIG. 5(c)
FIG. 5(d)
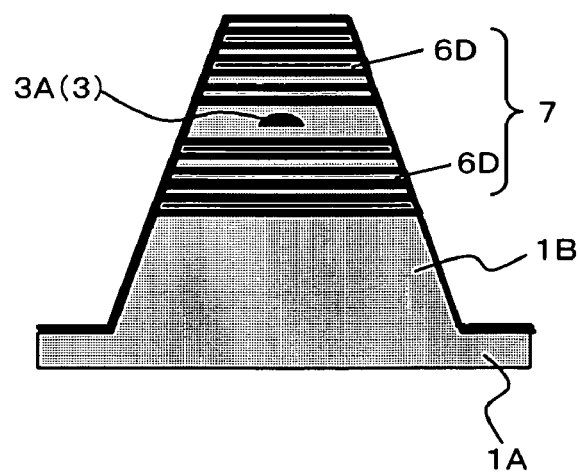
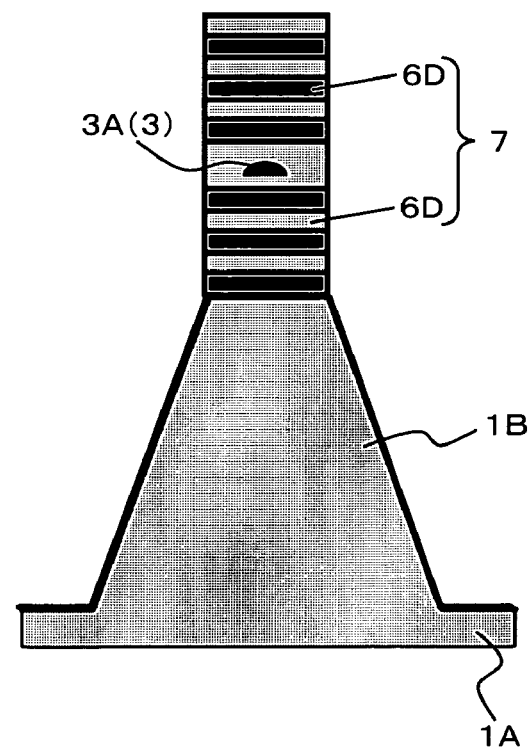

SINGLE-PHOTON GENERATING DEVICE, SINGLE-PHOTON DETECTING DEVICE, AND OPTICAL QUANTUM GATE

CROSS REFERENCE TO RELATED APPLICATIONS

This application is based on and hereby claims priority to Japanese Application No. 2006-063054 filed on Mar. 8, 2006 in Japan, the contents of which are hereby incorporated by reference.

BACKGROUND OF THE INVENTION (1) Field of the Invention

The present invention relates to single-photon generating device, single-photon detecting device (photodetector) and optical quantum gate acting as key devices for quantum information processing technology, particularly, quantum cryptography communication.

(2) Description of Related Art

In the BB84 protocol, a main stream protocol for quantum cryptography communication at present, cryptographic communication preventing wiretapping is realized by transmitting quantum information carried by a single photon.

For this purpose, a single-photon generating device for securely generating a photon one by one in a single pulse is necessary as a signal source (light source). However, it is difficult to realize such a single-photon generating device.

Accordingly, up to the present, a single-photon generating device has been realized in a simulated manner by weakening laser light so that the mean number of photons per pulse becomes on the order of 0.1 particle.

However, since the laser light is coherent light, there is a case that two photons or more are generated even when using such the weakened light. Thus, information may possibly be leaked to a wiretapper, of which probability is not negligible. Also, there is a problem that communication speed is extremely decreased when intending to carry out long distance communication safely. Therefore, in order to realize high-speed quantum cryptography communication, it is inevitable to realize a single-photon generating device.

As methods for realizing such the single-photon generating device, a variety of methods have been proposed so far.

Among such methods, as a promising technique for achieving high reliability in a telecommunication band, there is a single-photon generating device using light emission from a localized level in a solid substrate, particularly from an exciton level in a low-dimensional semiconductor represented by a quantum dot.

However, since the dielectric constant of a semiconductor is as large as three or more, the light generated from the quantum dot located inside the substrate is almost reflected on a substrate surface, and the ratio of the light outputting from the substrate surface to air is a few percent. Among the above output light, the light coupled to an optical fiber using, for example, an objective lens is merely 1% or less. Therefore, it is an important issue to increase extraction efficiency.

Accordingly, in order to increase the extraction efficiency in the single-photon generating device using light emission from the quantum dot in the semiconductor substrate, a device having the following structure has been proposed.

Namely, there has been proposed a method of forming a single-photon generating device including a self-organized quantum dot layer of InAs, and a DBR (Distributed-Bragg reflector) microresonator (microcavity, or simply, cavity) constituted of a DBR mirror of GaAs and AlAs through the epitaxial growth, and thereafter through etching onto a minute cylinder (micropost), so as to output substantially entire light inside the micropost cavity from the upper (surface) side (For example, refer to "Efficient Source of Single Photons: A Single Quantum Dot in a Micropost Microcabity", Matthew Pelton et al., Physical Review Letters, Volume 89, Number 23, Dec. 2, 2002.).

In the above structure, the coupling with a particular confinement mode can be strengthened in the cavity, thanks to the Purcell effect. It is possible to restrain light dissipation to an unintended direction, and to extract the light to a particular direction only. Thus, the extraction efficiency can be improved. Also, with a shortened emission lifetime thanks to the Purcell effect, it becomes possible to obtain such effects as an increase of a photon generating rate, as well as the mitigation of an influence of decoherence.

Further, by providing an electrode on the semiconductor layer including the quantum dot, additional functions may be provided in the single-photon generating device, such as enabling light emission through current injection, and varying a light emission wavelength by applying an electric field. In such an EL single-photon generating device, and an electric-field-controlled, variable-wavelength PL single-photon generating device, there are provided conductive semiconductor layers of, for example, GaAs on the upper and lower sides of a quantum dot layer of, for example, InAs, and also contact electrodes on the above conductive semiconductor layers (For example, refer to "Electrically Driven Single-Photon Source", Zhiliang Yuan et al., Science, Vol. 295, Jan. 4, 2002.).

However, according to the structure such as proposed in the above paper "Efficient Source of Single Photons: A Single Quantum Dot in a Micropost Microcabity", there is a problem that, when a photon ejects from the internal cavity to the external space, the space distribution thereof expands to a considerable extent, and as a result, the efficiency at the time of coupling to an optical fiber using, for example, an objective lens decreases to a non-negligible extent.

Also, because it is necessary to form a considerably thick hetero epitaxial growth layer for a DBR mirror on both upper and lower sides of the quantum dot layer, quality of the quantum dot may possibly be affected.

Further, because it is necessary to accurately manufacture an extremely long pillar shape including the DBR mirror, an advanced etching technique is required.

In particular, since the quantum dot (formed of, for example, InP) for emitting light of a telecommunication band (for example, 1.5-μm band) has a high strain stress internally, it is highly possible that dry etching may cause quality degradation of the quantum dot.

Further, in the EL single-photon generating device and the electric-field-controlled, variable-wavelength PL single-photon generating device, desirably, at least one of the electrodes is disposed in the vicinity of the quantum dot layer so as to efficiently perform current injection and electric field application to the quantum dot layer.

Accordingly, in the device described in the above paper "Electrically Driven Single-Photon Source", in order that only the light generated from one quantum dot (single photon) is output to the outside, a hole is produced in the contact electrode (metal electrode) provided on the upper portion of a mesa structure, and the light is extracted from the above hole (that is, from the surface side of the mesa structure).

However, it is difficult to increase the extraction efficiency with such the structure.

SUMMARY OF THE INVENTION

The present invention has been devised considering the above-mentioned issue. Aspect of the present invention can provide a single-photon generating device, a single-photon detecting device and an optical quantum gate capable of enhancing efficiency (extraction efficiency, detection efficiency and coupling efficiency) by a comparatively simple process without quality degradation.

According to one aspect of the present invention, a single-photon generating device includes a solid substrate having a base portion and a pillar portion. The above pillar portion is formed on the surface side of the base portion and has a localized level existent in the vicinity of the tip thereof. The pillar portion is also formed to have a larger cross section on the base portion side than the cross section on the tip side, so that the light generated from the localized level is reflected on the surface, propagated internally, and output from the back face side of the base portion.

Further, according to another aspect of the present invention, a single-photon detecting device includes a solid substrate having a base portion and a pillar portion being formed on the surface side of the base portion. The above pillar portion is formed to have a larger cross section on the base portion side than the cross section on the tip side, so that the light being incident from the back face side of the base portion, propagated internally, and reflected on the surface of the pillar portion can be absorbed at the localized level existent in the vicinity of the tip.

Still further, according to another aspect of the present invention, an optical quantum gate includes a solid substrate having a base portion and a pillar portion being formed on the surface side of the base portion. The above pillar portion is formed to have a larger cross section on the base portion side than the cross section on the tip side, so that the light being incident from the back face side of the base portion, propagated inside the pillar portion, and reflected on the surface of the pillar portion can interact to the localized level existent in the vicinity of the tip.

Thus, the single-photon generating device according to one aspect of the present invention has a merit capable of increasing the extraction efficiency of a single photon.

In particular, according to the device structure of the present single-photon generating device, in the single-photon generating device using a quantum dot emitting light in a telecommunication band, there is a merit that the extraction efficiency of a single photon, and the coupling efficiency to an optical fiber as well, can be increased by a comparatively simple process without quality degradation.

Also, the single-photon detecting device according to another aspect of the present invention has a merit of being capable of increasing the detection efficiency of a single photon.

Further, the optical quantum gate according to another aspect of the present invention has a merit capable of increasing the coupling efficiency of a single photon.

BRIEF DESCRIPTION OF THE DRAWINGS

FIGS. 3(a)-3(h) show schematic cross-sectional views illustrating an anti-reflection structure provided on a single-photon generating device, according to a first embodiment of the present invention.

FIGS. 5(a), 5(b) show schematic cross-sectional views illustrating a refection film provided on the pillar portion of a single-photon generating device, according to a first embodiment of the present invention.

FIGS. 5(c), 5(d) show schematic cross-sectional views illustrating a resonator (cavity) structure provided on the pillar portion of a single-photon generating device, according to a first embodiment of the present invention.

DESCRIPTION OF THE PREFERRED EMBODIMENTS

Figure 1:
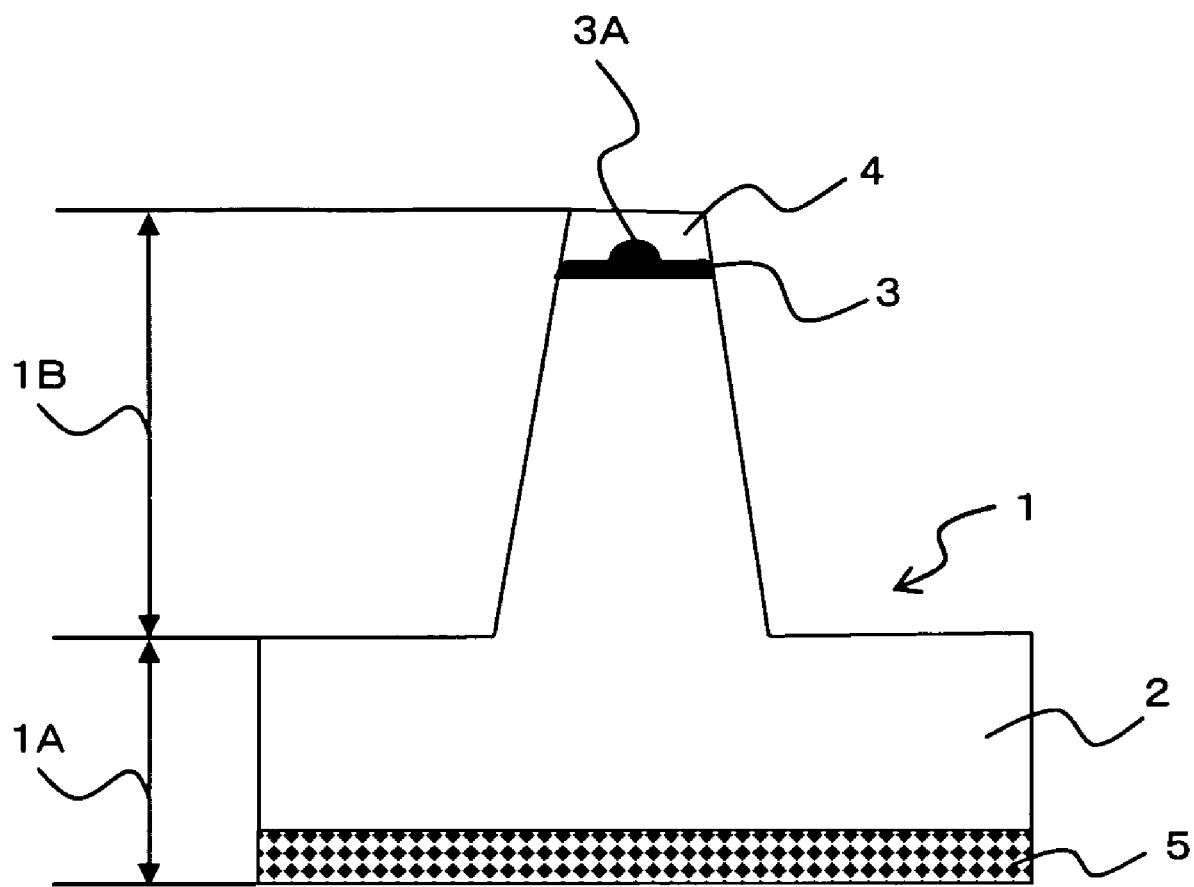
FIG. 1 shows a schematic cross-sectional view illustrating the entire structure of a single-photon generating device according to one embodiment of the present invention.

Hereafter, single-photon generating device, single-photon detecting device and optical quantum gate according to the preferred embodiments of the present invention will be described referring to the drawings.

First Embodiment

Hereinafter, the single-photon generating device according to a first embodiment of the present invention will be described referring to FIGS. 1 to 7.

The single-photon generating device according to the present embodiment is an optically pumped (PL) single-photon generating device using light emission from a quantum dot in a semiconductor substrate.

According to the present embodiment, a semiconductor substrate (solid substrate) 1 including an epitaxial growth layer constituted of a semiconductor material, for example, the InP related semiconductor material is used, as shown in FIG. 1. The above semiconductor substrate 1 is constituted of an i-InP substrate (including an i-InP layer) 2 on which an InAs layer 3, as quantum dot layer, and an i-InP layer 4 are laminated (stacked), as exemplarily shown in FIG. 1.

Also, according to the present embodiment, as shown in FIG. 1, the semiconductor substrate 1 includes a base portion 1A, a pillar portion 1B being formed to protrude from the surface side of the base portion 1A, and a quantum dot layer 3 in the vicinity of the tip of the pillar portion 1B.

Figure 7:
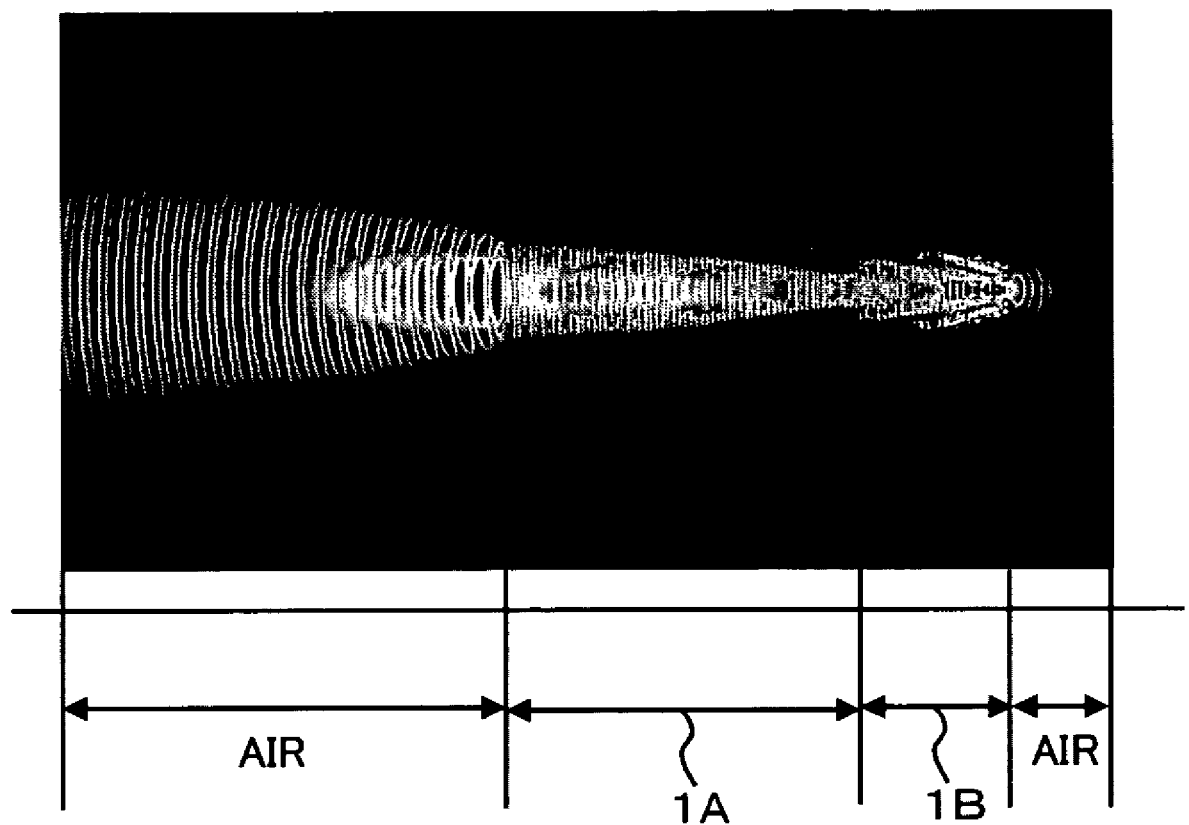
FIG. 7 shows a diagram illustrating the effect of a single-photon generating device according to a first embodiment of the present invention.

As such, because the quantum dot layer 3 is disposed in the vicinity of the tip of the pillar portion 1B, light generated from the exciton level (exciton level in a low-dimensional semiconductor; localized level) of a quantum dot 3A is mostly reflected without being output from the surface (upper face and side face) of the pillar portion 1B, while the most light is propagated inside the pillar portion 1B and output from the back face side of the base portion 1A (for example, refer to FIG. 7). For this reason, the present device is termed single-photon generating device of a back-face output type.

Here, because the light generated from the quantum dot 3A has lower energy than the absorption edge of the semiconductor material constituting the pillar and base portions, the light is not absorbed while being propagated.

Also, because the light generated from the quantum dot 3A is propagated much longer than the wavelength inside a narrow solid angle toward the back face side of the base portion 1A, the light comes to have a wavefront of a plane wave or close thereto (for example, refer to FIG. 7). As a result, the light is output from the back face of the base portion 1A substantially perpendicularly. Accordingly, the reflection on the back face of the base portion 1A is relatively small.

Reversely to say, in order to reduce the reflection on the back face of the base portion 1A, it is necessary to configure so that the distance between the quantum dot layer 3 provided on the pillar portion 1B and the back face of the base portion 1A becomes a predetermined distance or longer. Typically, it is preferable to configure such that the height of the pillar portion 1B is on the order of ten times as long as, or longer than the light wavelength propagated in the semiconductor substrate 1 constituted of the base portion 1A and the pillar portion 1B.

Here, as shown in FIG. 1, the pillar portion 1B is configured such that the cross section on the base portion 1A side is larger than the cross section on the tip side. In other words, the pillar portion 1B is configured such that the cross section thereof becomes gradually smaller, as the cross section moves farther from the base portion 1A side toward the tip side. In this case, the side face of the pillar portion 1B becomes a slope face (inclined plane) toward the inside of the pillar portion 1B.

Here, the tip side of the pillar portion 1B is formed thin (that is, the cross section of the tip side of the pillar portion 1B is formed no larger than a predetermined value), and the quantum dot layer 3 is provided in the vicinity of the thin tip of the pillar portion 1B as formed above. The reason for the above structure is that, by reducing to the minimum the number of the quantum dot 3A included in the quantum dot layer 3, and by reducing the number of light propagation modes of light generated from the quantum dot 3A, it is intended to enable the device to function as single-photon generating device.

Meanwhile, the base portion 1A side of the pillar portion 1B is formed thick (that is, the cross section of the pillar portion 1B on the base portion 1A side is formed larger than the predetermined value).

Particularly, the base plane of the pillar portion 1B (that is, an interface between the pillar portion 1B and the base portion 1A) has a size (a diameter in case of the pillar portion 1B of a circular cone shape) on the order of a few times as long as, or longer than the wavelength of light propagated in the pillar portion 1B. The reason is that, if the size of the pillar portion 1B is formed as short as, or shorter than the wavelength of light propagated in the pillar portion 1B, the light is diffused due to diffraction, which results in degradation of the coupling efficiency to an optical fiber.

Specifically, it is preferable that the tip side of the pillar portion 1B is formed thin, and also the base portion 1A side of the pillar portion 1B is formed thick, so that the angle of the slope face constituting the side face of the pillar portion 1B (namely, the angle formed between the pillar portion 1B and the base portion 1A; base angle) becomes within a predetermined angle range (typically, within the range of the order of 65 to 85 degrees).

In the present invention, the reason for configuring the pillar portion 1B as described above is as follows:

Since there is a large difference in the refractive indexes between the semiconductor material and the air, most light generated from the quantum dot 3A and propagated through the semiconductor layer (epitaxial growth layer) 4 is undesirably reflected, except for the case that the light is incident to the surface (upper face and side face) of the pillar portion 1B, that is, the interface to the air, perpendicularly or substantially perpendicularly. For example, assuming that the refractive index of the semiconductor material is 3, total reflection occurs when the incident angle is 19.5 degrees or more. The above is one cause that makes it difficult to increase the extraction efficiency.

Accordingly, the inventors of the present invention have changed an idea. Namely, by turning to advantage the fact that most light is reflected on the surface of the pillar portion 1B, an idea of extracting light from the back face side of the base portion 1A, instead of extracting the light from the surface side of the pillar portion 1B, has been derived. As a structure capable of increasing efficiency (extraction efficiency and coupling efficiency) of the single-photon generating device, such the structure as described above is adopted.

Now, to obtain a greater increase in the efficiency (extraction efficiency and coupling efficiency), the following structure is preferable.

First, preferably, the pillar portion 1B is formed to have a shape identical or close to a shape of a rotational symmetric body.

In this case, at least the shape of a portion covering the quantum dot layer 3 of the pillar portion 1B [a portion upper than the quantum dot layer 3; here, the i-InP layer (semiconductor layer) 4] may well be formed to have a shape of a rotational symmetric body having an axis of revolution perpendicular to the base portion 1A, with one quantum dot 3A included in the quantum dot layer 3 as focus. Specifically, the entire pillar portion 1B may be formed to have a shape of a rotational symmetric body, or a shape constituted of a portion thereof. Or, it may also be possible to form only the portion upper than the quantum dot layer 3 of the pillar portion 1B to have a shape of a rotational symmetric body.

With such the structure, due to the principle of a parabola antenna, most light generated from the quantum layer 3A can be propagated as collimate light proceeding in parallel toward the back face side of the base portion 1A.

Here, as the shape identical or close to the shape of a rotational symmetric body, there are included a shape of a rotational symmetric body, a shape constituted of a portion of a rotational symmetric body, a shape including a portion of a rotational symmetric body, and a shape of the combination of rotational symmetric bodies.

Figures 2A, 2B, 2C, 2D, 2E, 2F, 2G, 2H, 2I, 2J, 2K, 2L, 2M:
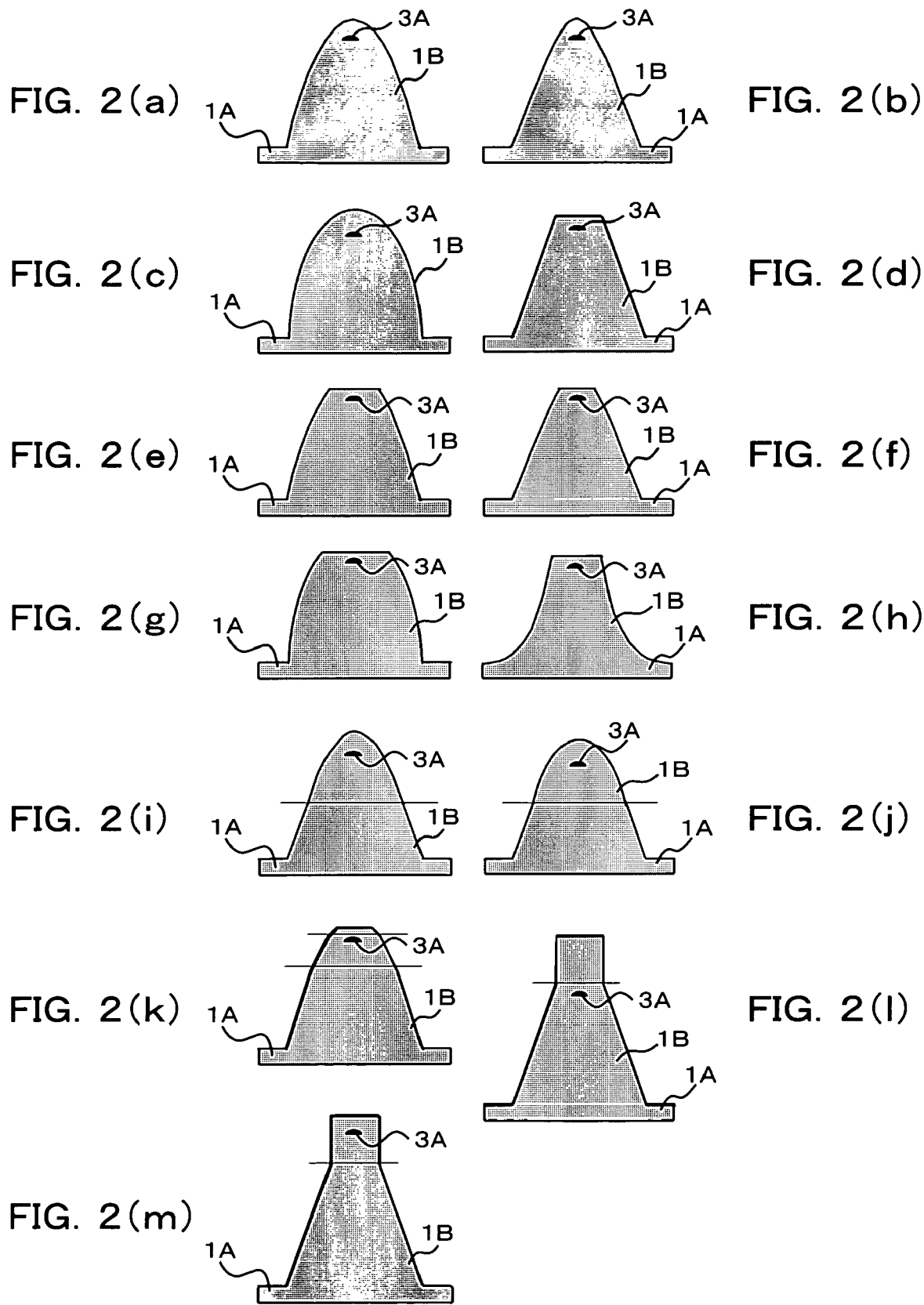
FIGS. 2(a)-2(m) show schematic cross-sectional views illustrating a shape of the pillar portion of a single-photon generating device according to a first embodiment of the present invention.

Specifically, the shape identical or close to the shape of a rotational symmetric body includes a shape of a paraboloidal body of revolution (a three-dimensional shape surrounded by a paraboloid of revolution) as shown in FIG. 2(a); a shape of a hyperboloidal body of revolution (a three-dimensional shape surrounded by a hyperboloid of revolution) as shown in FIG. 2(b); a shape constituted of a portion of an ellipsoid of revolution as shown in FIG. 2(c); a frustum shape of circular cone as shown in FIG. 2(d); a shape of a paraboloidal body of revolution of which upper portion is cut away, as shown in FIG. 2(e); a shape of a hyperboloidal body of revolution of which upper portion is cut away, as shown in FIG. 2(f); a shape constituted of a portion of an ellipsoid of revolution, of which upper portion is cut away, as shown in FIG. 2(g); a shape like Mt. Fuji as shown in FIG. 2(h) (that is, a frustum shape of circular cone of which slope face has a gradient being less steep toward the downward direction); a combined shape of a paraboloidal body of revolution and a frustum of circular cone, as shown in FIG. 2(i); a combined shape of a portion of an ellipsoid of revolution and a frustum of circular cone, as shown in FIG. 2(j); a combined shape of a plurality of frusta of circular cone, as shown in FIG. 2(k); a combined shape of a circular cylinder and a frustum of circular cone, as shown in FIG. 2(l) (a shape in which the quantum dot, a light emission source, is positioned in the vicinity of an upper portion of the frustum of circular cone); and a combined shape of a circular cylinder and a frustum of circular cone, as shown in FIG. 2(m) (a shape in which the quantum dot, a light emission source, is positioned in a portion of the circular cylinder).

Additionally, in case of the frustum shape of circular cone, the electromagnetic field becomes complicated to a certain extent due to the interference between the propagation modes in the pillar portion 1B. However, it has been confirmed through numerical calculation that most light can be collected within a narrow solid angle toward the back face side of the base portion 1A by appropriately designing the shape of the pillar portion 1B [i.e. the position of the quantum dot 3A, the height of the pillar portion 1B, and the diameter of the pillar portion 1B and angle of the side face (slope face) of the pillar portion 1B].

Also, though the shape identical or close to the shape of a rotational symmetric body is used here, the shape is not limited thereto. For example, even in case of a frustum shape of pyramid, instead of a rotational symmetric body, light collection effect to the direction to the back face side of the base portion 1A can be expected.

Further, preferably, an anti-reflection film (AR film; or anti-reflective coating) 5 is formed on the back face side of the base portion 1A, as shown in FIG. 1, so as to reduce reflection on the back face of the base portion 1A, and to increase the extraction efficiency. As described earlier, the light propagated in the pillar portion 1B comes to have a wavefront of a plane wave or close thereto on the backface side of the base portion 1A (for example, refer to FIG. 7). Accordingly, as exemplarily shown in FIG. 3(a), by forming a dielectric film 5A [specifically, a single-layered dielectric film (for example, SiN film) of a quarter wavelength] as the anti-reflection film 5, anti-reflection effect can be obtained easily.

In addition, here, the dielectric film 5A is provided on the back face side of the base portion 1A as anti-reflection film 5. However, in order to improve the collective property of light on the back face side of the base portion 1A, and to increase the extraction efficiency further, preferably, a collection lens (collection structure), such as a convex lens and a Fresnel lens, is provided on the back face side of the base portion 1A.

For example, as shown in FIG. 3(b), it may also be possible to form a convex lens 5B on the back face side of the base portion 1A using a dielectric film In this case, after the dielectric film is formed on the back face side of the base portion 1A, the above dielectric film may be processed to have a convex lens shape.

Also, as shown in FIG. 3(c), a convex lens 5C may be formed by etching the back face side of the base portion 1A (semiconductor substrate 2). In other words, the back face side of the base portion 1A may be processed to have the convex lens shape.

Also, as shown in FIG. 3(d), the convex lens 5C may be formed by etching the back face side of the base portion 1A (that is, the back face side of the base portion 1A is processed to have the convex lens shape), and the dielectric film (anti-reflection film) 5A may be formed to cover the back face side of the base portion 1A.

Also, as shown in FIG. 3(e), a Fresnel lens 5D may be formed on the back face side of the base portion 1A using a dielectric film In this case, after the dielectric film is formed on the back face side of the base portion 1A, the above dielectric film may well be processed to have the Fresnel lens shape.

Also, as shown in FIG. 3(f), a Fresnel lens 5E may be formed by etching the back face side of the base portion 1A. In this case, the back face side of the base portion 1A may be processed to have the Fresnel lens shape.

Also, as shown in FIG. 3(g), a dielectric film (anti-reflection film) 5A may be formed to cover the back face side of the base portion 1A, and also a Fresnel lens 5D may be formed by processing the surface of the dielectric film 5A (that is, the dielectric film surface may be processed to have the Fresnel lens shape).

Also, as shown in FIG. 3(h), after a Fresnel lens 5E is formed by etching the back face side of the base portion 1A (that is, after the back face side of the base portion 1A is processed to have the Fresnel lens shape), the dielectric film (anti-reflection film) 5A may be formed in such a way so as to cover the surface of the Fresnel lens shape.

As such, by forming a convex lens or a Fresnel lens on the back face side of the base portion 1A, it becomes possible to improve the light collection property on the back face side of the base portion 1A, and to increase the extraction efficiency further.

As another structure, as shown in FIGS. 4(a)-4(k), it is preferable to form reflection films 6 (6A-6D) as to cover the entire or a portion of the surface of the pillar portion 1B so that the light generated from the quantum dot 3A may be reflected (namely, the light is not output from the surface of the pillar portion 1B).

In particular, preferably, the reflection films 6 are formed on the surface of the tip portion (vertex portion) of the pillar portion 1B (namely, the upper face of the pillar portion 1B).

With this, it is possible to increase the reflectivity of light being incident to the upper face of the pillar portion 1B substantially perpendicularly thereto. Also, due to the reflection effect, the light directing toward the side face direction of the pillar portion 1B can be suppressed.

Here, the reflection film 6 may well be configured either one of metal film (for example, Au, Pt, Al) 6A, dielectric film 6B and metal film 6A, dielectric multilayer film 6C, dielectric multilayer film 6C and metal film 6A, and semiconductor multilayer film 6D.

Figures 4A, 4B:
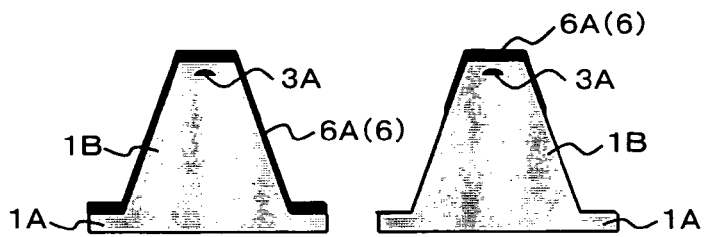
FIGS. 4(a)-4(k) show schematic cross-sectional views illustrating a refection film provided on the pillar portion of a single-photon generating device, according to a first embodiment of the present invention.

For example, shown in FIG. 4(a), it may also be possible to form the metal film 6A on the entire faces on the surface sides of both the pillar portion 1B and the base portion 1A. Similarly, as shown in FIG. 4(g), the dielectric film 6B and the metal film 6A may be formed on the entire face of the surface sides of the pillar portion 1B and the base portion 1A. Also, similarly, as shown in FIG. 4(j), the dielectric multilayer film 6C may be formed on the entire face of the surface sides of the pillar portion 1B and the base portion 1A.

Also, as exemplarily shown in FIG. 4(b), the metal film 6A may be formed to cover the vicinity of the tip of the pillar portion 1B (that is, the upper face of the pillar portion 1B and the side face of the vicinity of the upper face of the pillar portion 1B).

Figures 4C, 4D:
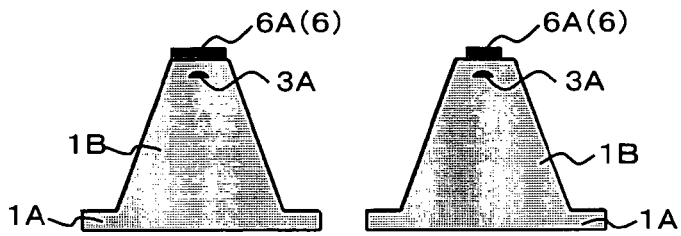

Also, as exemplarily shown in FIG. 4(c), the metal film 6A may be formed so as to cover the upper face of the pillar portion 1B. Similarly, as shown in FIG. 4(h), the dielectric film 6B and the metal film 6A may be formed so as to cover the upper face of the pillar portion 1B. Also, similarly, as shown in FIG. 4(k), the dielectric multilayer film 6C may be formed so as to cover the upper face of the pillar portion 1B.

Figures 4E, 4F:
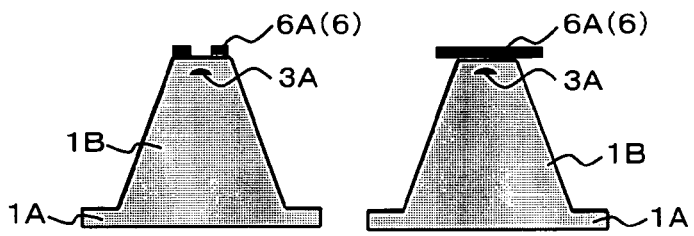
Figures 4G, 4H:
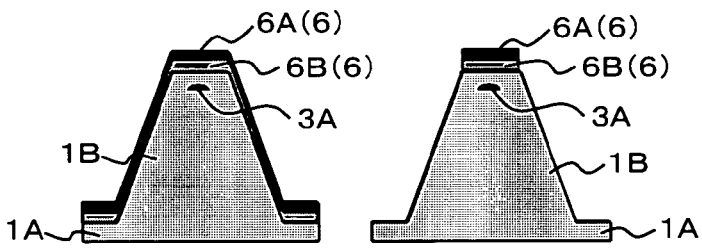
Figure 4I:
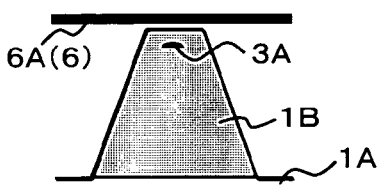
Figures 4J, 4K:
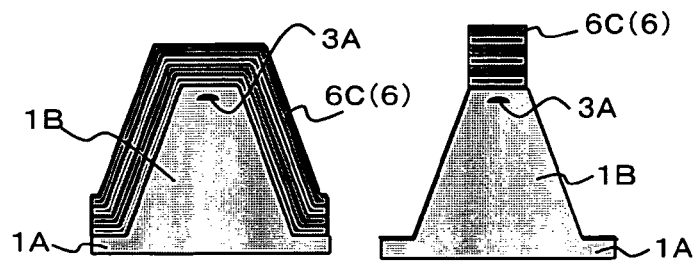

Further, as exemplarily shown in FIGS. 4(d), 4(e), the metal film 6A may be formed so as to cover a portion of the upper face of the pillar portion 1B. In this case, as shown in FIG. 4(d), the metal film 6A may be formed only on an upper area of the quantum dot 3A, the light emission source, or as shown in FIG. 4(e), the metal film 6A may be formed only on an area other than the upper area of the quantum dot 3A, the light emission source.

Also, as exemplarily shown in FIG. 4(f), the metal film 6A having an overhang may be formed so as to cover the upper face of the pillar portion 1B. Also, as exemplarily shown in FIG. 4(i), the metal film 6A supported by another member (not shown) may be provided in the upward direction of both the pillar portion 1B and the base portion 1A, and in a position close to the upper face of the pillar portion 1B. In short, the metal film 6A functioning as reflection film is not necessarily disposed on the surface of the pillar portion 1B, but may be disposed in a position apart from the surface of the pillar portion 1B as shown above, by the intermediary of, for example, an air layer.

Also, as exemplarily shown in FIG. 5(a), it may be possible to configure the pillar portion 1B having a frustum shape of circular cone, by providing, in the vicinity of the tip thereof, a semiconductor multilayer film (semiconductor multilayer film mirror; for example, DBR mirror) 6D capable of functioning as the reflection film 6. Namely, when forming the pillar portion 1B, it may also be possible to form the semiconductor multilayer film 6D on the tip side farther than the quantum dot 3A of the pillar portion 1B by alternately laminating (stacking) semiconductor films having different refractive indexes, and thereby configure the pillar portion 1B to have the frustum shape of a circular cone as a whole.

Also, as exemplarily shown in FIG. 5(b), it may be possible to configure to have the semiconductor multilayer film (semiconductor multilayer film mirror) 6D of a circular cylinder shape on the upper face of the pillar portion 1B having a frustum shape of circular cone. Namely, it may be possible to form the semiconductor multilayer film 6D of circular cylinder shape on the upper side of the pillar portion 1B by alternately laminating (stacking) semiconductor films having different refractive indexes, so that the pillar portion 1B has a combined shape of a frustum shape of circular cone and a circular cylinder shape. Here, a structure having the quantum dot 3A in a portion of a frustum shape of circular cone of the pillar portion 1B is illustrated.

The reflection film 6 thus formed also functions as a surface protection (passivation) film capable of protecting the surface of the pillar portion 1B. Additionally, separately from the reflection film 6, it may also be possible to provide the surface protection film so as to cover the surface of the pillar portion 1B. Also, if the light can securely be output from the back face of the substrate by devising the shape, etc. of the pillar portion 1B, it is not always necessary to provide the reflection film 6.

In this case, preferably, the surface protection film is provided in place of the reflection film 6. Also, the surface protection film may be provided in such a way as to cover the surface of the pillar portion 1B.

Now, as shown in FIGS. 5(c), 5(d), it is also preferable that the pillar portion 1B is configured to have a resonator structure 7 constituted of semiconductor multilayer films 6D formed on both the upper and the lower sides of the portion (quantum dot layer 3) having the quantum dot 3A formed therein. With this, because of the shortening of the light emission lifetime thanks to the Purcell effect, photon generation rate can be increased and the effect of decoherence can be mitigated, and further, since the number of modes of the emitted light becomes one, it becomes easy to increase the extraction efficiency, also.

For example, as exemplarily shown in FIG. 5(c), the pillar portion 1B having a frustum shape of circular cone may be configured to have a structure such that the quantum dot 3A is sandwiched by the semiconductor multilayer films (semiconductor multilayer film mirror) 6D in the vicinity of the tip of the pillar portion 1B. Namely, when forming the pillar portion 1B, by successively laminating (stacking) a lower-side semiconductor multilayer film 6D, the quantum dot layer 3 including the quantum dot 3A and an upper-side semiconductor multilayer film 6D in the vicinity of the tip of the pillar portion 1B, using, for example, the hetero epitaxial growth technology or the like, and thereby the pillar portion 1B may be configured to have the frustum shape of circular cone as a whole.

Also, as exemplarily shown in FIG. 5(d), it may also be possible to configure to have a stacking body of a circular cylinder shape, in which the quantum dot layer 3 including the quantum dot 3A is sandwiched by the semiconductor multilayer films (semiconductor multilayer film mirrors) 6D, being disposed on a frustum of circular cone. Namely, it is possible to form in such a way that the lower-side semiconductor multilayer film 6D, the quantum dot layer 3 including the quantum dot 3A, and the upper-side semiconductor multilayer film 6D are successively laminated (stacked) into a circular cylinder shape on the frustum of circular cone. The above structure may also be regarded such that the pillar portion 1B is configured as a combination of a frustum shape of circular cone with a circular cylinder shape, and that the quantum dot 3A and the semiconductor multilayer films 6D are provided in a circular cylinder shape portion.

Hereafter, referring to the schematic cross sectional views shown in FIGS. 6(a) through 6(i), a manufacturing method of a single-photon generating device [optically pumped (PL) single-photon generating device] according to the present embodiment will be described.

Additionally, in the present embodiment, there is described an exemplary case of using a semiconductor substrate 1 including an epitaxial growth layer of the InP-system and having a quantum dot layer 3 in the vicinity of the surface, using a $SiO_2$ mask as a pillar-forming mask 8, and forming a SiN film as an AR film 5, as shown in FIGS. 6(a) through 6(i).

Figure 6A:
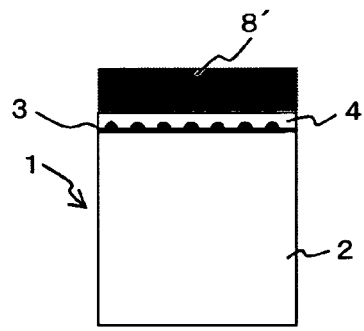
FIGS. 6(a)-6(i) show schematic cross-sectional views illustrating a manufacturing method of a single-photon generating device according to a first embodiment of the present invention.

First, as shown in FIG. 6(a), a $SiO_2$ film 8' is formed on the semiconductor substrate 1 having the quantum dot layer 3 in the vicinity of the surface, by growing $SiO_2$, a material for the pillar-forming mask, to a thickness of, for example, 1,000 nm, under the conditions of, for example, a substrate temperature of approximately 300° C., and a pressure of approximately 0.15 Torr, using an LP-CVD apparatus in which, for example, monosilane and oxygen are used as reaction gases.

Figure 6B:
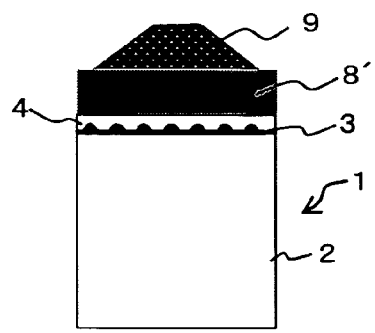
Figure 6C:
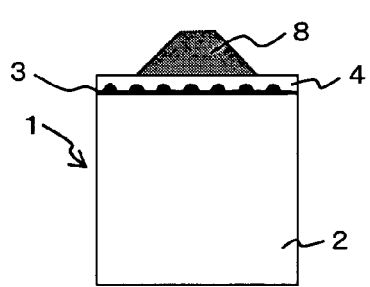
Figure 6D:
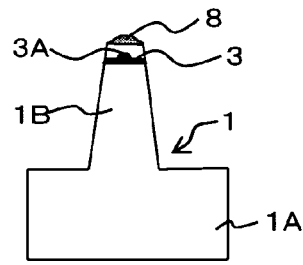
Figure 6E:
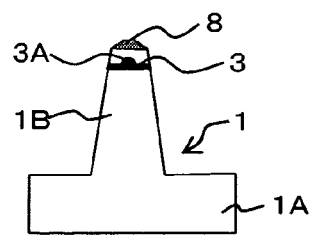
Figure 6F:
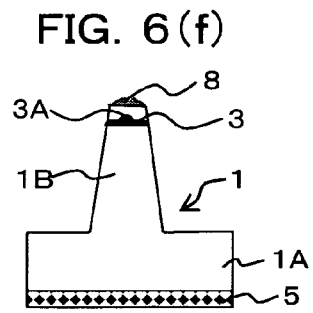
Figure 6G:
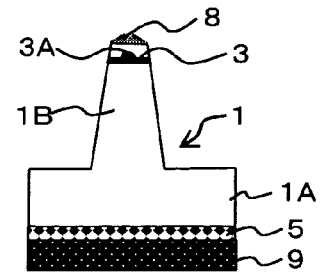
Figure 6H:
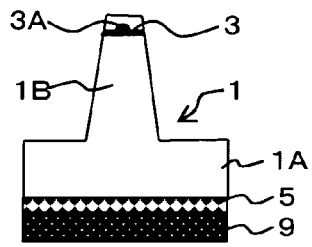
Figure 6I:
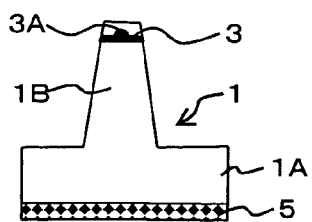

Subsequently, as shown in FIG. 6(b), a photoresist is coated on the $SiO_2$ film 8' to a thickness of, for example, approximately 2,000 nm. Then, a resist mask 9 having the pattern of a frustum shape of circular cone with a diameter of, for example, approximately 6,000 nm is formed, using a contact exposure apparatus.

Using the above resist mask 9, for example, by performing wet etching using a buffered hydrofluoric acid solution, the mask pattern is transferred to the $SiO_2$ film 8'. Thus, as shown in FIG. 6(*c*), the $SiO_2$ mask (pillar-forming mask) 8 having a diameter of, for example, approximately 4,000 nm is formed. Thereafter, the resist mask is removed using a removing liquid.

Next, using the $SiO_2$ mask 8 thus formed, by an ICP dry etching apparatus using, for example, tetrachlorosilane and argon as reaction gases, a pillar portion 1B having a height of, for example, approximately 10,000 nm, and having the quantum dot layer 3 including the quantum dot 3A existent in the vicinity of the tip, is formed, as shown in FIG. 6(*d*). The above process is performed under the conditions of, for example, a substrate temperature of approximately 200° C., and a pressure of 0.5 Torr. Here, after the above etching, the portion remaining on the lower side of the pillar portion 1B becomes the base portion 1A. In other words, the pillar portion 1B is formed on the surface side of the base portion 1A.

As such, as a processing process of the surface side of the substrate, dry etching is performed onto the semiconductor substrate 1 having the quantum dot 3A existent in the vicinity of the surface. Thus, the pillar portion 1B is formed to have the cross section on the base portion 1A side larger than the cross section on the tip side, as shown in FIG. 6(*d*), so that the light generated from the quantum dot 3A included in the quantum dot layer 3 is reflected on the surface (upper face and side face) of the pillar portion 1B, propagated inside the pillar portion 1B, and output from the back face side of the base portion 1A.

Additionally, here, in order to form the pillar portion 1B, only dry etching is performed under the predetermined conditions. However, the method for forming the pillar portion 1B is not limited thereto, but it may also be possible to perform only wet etching under predetermined conditions.

Subsequently, the pillar portion 1B is protected by coating the photoresist to produce a thickness of, for example, approximately 10,000 nm so as to cover the entire pillar portion 1B. Thereafter, as shown in FIG. 6(*e*), mirror finishing is performed by polishing the back face of the substrate (back face of the base portion 1A), for example, as thick as approximately 150,000 nm.

Next, the photoresist used for protecting the pillar portion 1B is removed using a removing liquid. Thereafter, as shown in FIG. 6(*f*), using a plasma CVD apparatus, SiN, which is to be a material for forming the AR film 5, is grown to a thickness of, for example, approximately 200 nm, under the conditions of, for example, a substrate temperature of approximately 250° C., and a pressure of approximately 1 Torr, using, for example, monosilane, ammonia and nitrogen as reaction gases. Thus, the SiN film is formed as AR film 5.

Subsequently, as shown in FIG. 6(*g*), the photoresist 9 is coated on the surface of the AR film 5 being formed on the back face of the substrate for protection. Thereafter, as shown in FIG. 6(*h*), the $SiO_2$ mask 8 having protected the tip of the pillar portion 1B (pillar top portion) is removed by performing wet etching using, for example, a buffered hydrofluoric acid solution.

Next, as shown in FIG. 6(*i*), the photoresist having protected the AR film 5 is removed using a removing liquid.

In such a way, the optically pumped single-photon generating device is formed.

Thus, according to the single-photon generating device in accordance with the present embodiment, because the shape of the pillar portion 1B is devised so as to output light from the back face side of the substrate, there is a merit that the extraction efficiency of a single photon can be increased.

In particular, as the calculation result is shown in FIG. 7, by forming the pillar portion 1B to have a shape of circular cone satisfying the above-mentioned condition, it has been confirmed that most light can be collected in a narrow solid angle toward the back face side of the base portion 1A, and the light can be output from the back face of the base portion 1A substantially perpendicularly, with a wavefront of a plane wave or close to a plane wave on the back face side of the base portion 1A.

Also, according to the device structure of the present single-photon generating device, in the single-photon generating device using the quantum dot 3A emitting light in the telecommunication band, there is a merit that the extraction efficiency of a single photon, and the coupling efficiency to an optical fiber as well, can be increased by a comparatively simple process without quality degradation. Specifically, according to the present single-photon generating device, irrespective of an optical pumping type or an EL type (current injection type), it becomes possible to obtain the light emission efficiency of several tens percent, which has not been achieved using the conventional structure. Further, the extracted light has features of relatively well rectilinearity and easiness for collecting to an optical fiber using a lens.

Additionally, when configuring the present device as, for example, electric-field controlled variable wavelength PL device, a voltage application electrode (for example, a conductor film capable of functioning as electrode; metal film) is to be disposed on the upper face (surface side) of the pillar portion 1B. Because the present device is configured such that light is extracted from the back face side, it is not necessary to dig a hole in the electrode, as was conventionally required. Also, because the metal electrode (conductor film) disposed on the surface side of the pillar portion 1B can be used as reflection film capable of reflecting the light generated from the quantum dot 3A, the extraction efficiency can be improved even using such the device having the electrode on the surface side.

Second Embodiment

Next, a single-photon generating device according to a second embodiment of the present invention will be described referring to FIGS. 8(*a*)-8(*d*).

The manufacturing method of the single-photon generating device according to the present embodiment is different from the manufacturing method of the single-photon generating device according to the first embodiment. Namely, according to the present embodiment, by combining dry etching with wet etching having different anisotropy in the processing process of the surface side, the shape of the pillar portion 1B, in particular, an angle of the side face (slope face) can be adjusted, while aiming to reduce etching damage also.

According to the present embodiment, in the process for forming the pillar portion 1B, one or more wet etching processes having different etching conditions are used in combination with one or more dry etching processes having different etching conditions.

Hereafter, the manufacturing method of the single-photon generating device according to the present embodiment is concretely described, referring to FIGS. 8(*a*)-8(*d*) and 9(*a*)-9(*d*).

First, similar to the method in the above-mentioned first embodiment, a $SiO_2$ film 8' is formed on a semiconductor substrate 1 having a quantum dot layer 3 in the vicinity of the surface [refer to FIG. 6(a)]. Next, a resist mask 9 is formed [refer to FIG. 6(b)], which is then transferred to the SiO$_2$ film 8', so as to form a SiO$_2$ mask 8 [refer to FIG. 6(c)].

Figure 8A:
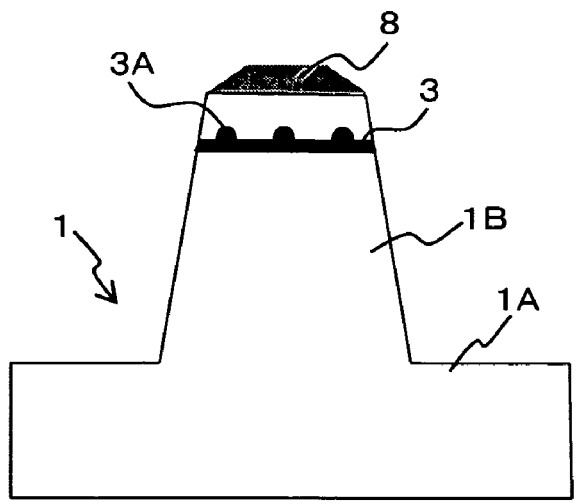
FIGS. 8(a)-8(d) show schematic cross-sectional views illustrating a manufacturing method of a single-photon generating device according to a second embodiment of the present invention.

Next, using the SiO$_2$ mask 8 thus formed, by an ICP dry etching apparatus using, for example, tetrachlorosilane and argon as reaction gases, a pillar portion 1B, having a height of, for example, approximately 10,000 nm and having the quantum dot layer 3 including the quantum dot 3A existent in the vicinity of the tip, is formed, as shown in FIG. 8(a). The above process is performed under the conditions of, for example, a substrate temperature of approximately 200° C., and a pressure of 0.5 Torr. Here, after the above etching, the portion remaining on the lower side of the pillar portion 1B becomes the base portion 1A. In other words, the pillar portion 1B is formed on the surface side of the base portion 1A. Additionally, in FIGS. 8(a)-8(d), like reference numerals are given to like parts described in the aforementioned first embodiment [refer to FIGS. 6(a)-6(i)].

Figure 8B:
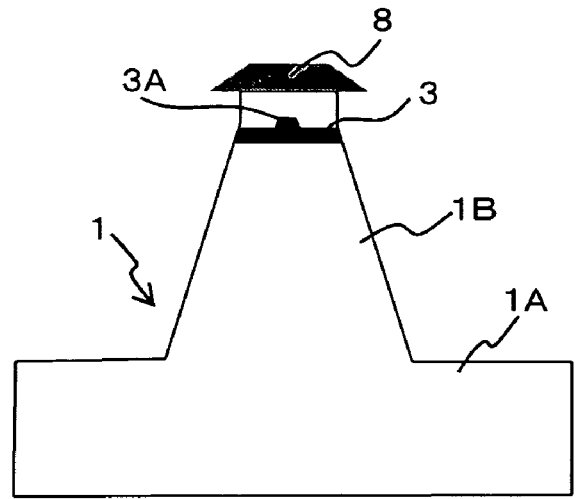

Subsequently, using the SiO$_2$ mask 8, wet etching is performed using, for example, a mixed liquid of a few percent of hydrobromide and hydrogen peroxide. Through the above wet etching, the slope angle of the pillar portion 1B is adjusted so as to produce the shape of the pillar portion 1B from a frustum shape of circular cone as shown in FIG. 8(a) to a combined shape of the frustum of circular cone and a circular cylinder as shown in FIG. 8(b), and also, a damaged layer produced at the time of dry etching is removed.

Through the above-mentioned wet etching, the number of the quantum dot 3A included in the quantum dot layer 3 is reduced to the minimum, and the number of propagation modes of light generated from the quantum dot 3A is reduced to the minimum, so that the manufactured device can function as single-photon generating device.

Figure 8C:
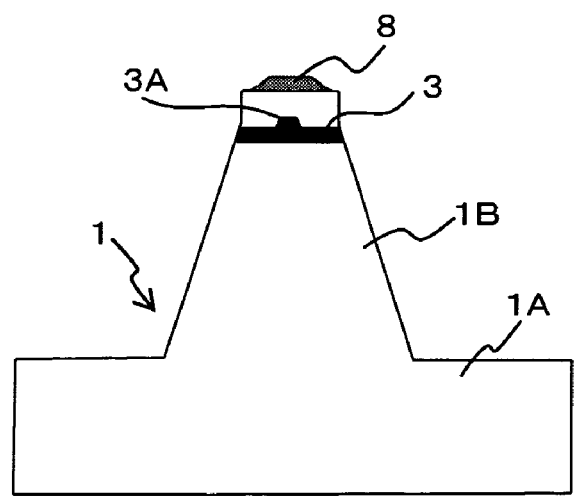
Figure 8D:
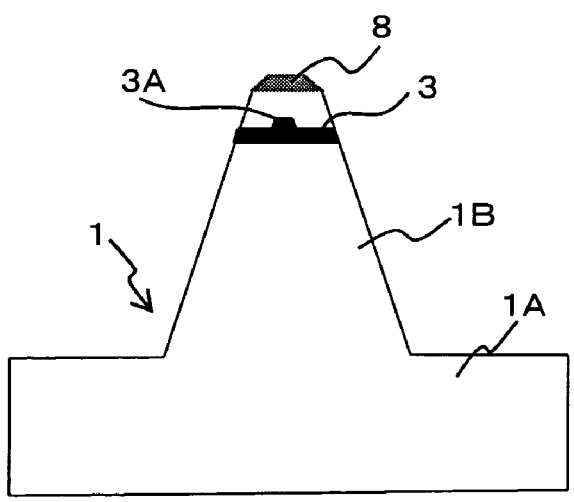

Next, as shown in FIGS. 8(c), 8(d), adjustment of the slope angle (slope adjustment) on a tip side of the pillar portion 1B (pillar top portion) generated through the above-mentioned wet etching is performed.

Here, as shown in FIG. 8(c), the SiO$_2$ mask 8 formed on the upper face of the pillar portion 1B is shrunk by performing dry etching using, for example, a CF$_4$ gas as a reaction gas, and wet etching using, for example, a buffered hydrofluoric acid solution. Thereafter, as shown in FIG. 8(d), wet etching is performed using, for example, a mixed liquid of a few percent of hydrobromide and hydrogen peroxide, and thereby the slope angle on the tip side of the pillar portion 1B is adjusted.

As such, by performing dry etching combined with wet etching, the pillar portion 1B is formed to have the cross section on the base portion 1A side larger than the cross section on the tip side, so that the light generated from the quantum dot 3A included in the quantum dot layer 3 is reflected on the surface (upper face and side face) of the pillar portion 1B, propagated inside the pillar portion 1B, and output from the back face side of the base portion 1A.

Thereafter, similar to the aforementioned first embodiment, after performing mirror finishing by polishing the back face of the substrate (back face of the base portion 1A), a SiN film is formed as AR film 5. Then, while protecting the above AR film 5, the SiO$_2$ mask 8 is removed, and thus, the optically pumped single-photon generating device is formed.

Additionally, it may also be possible to adjust the distance from the upper face of the pillar portion 1B to the quantum dot layer 3 in the following way.

Figure 9A:
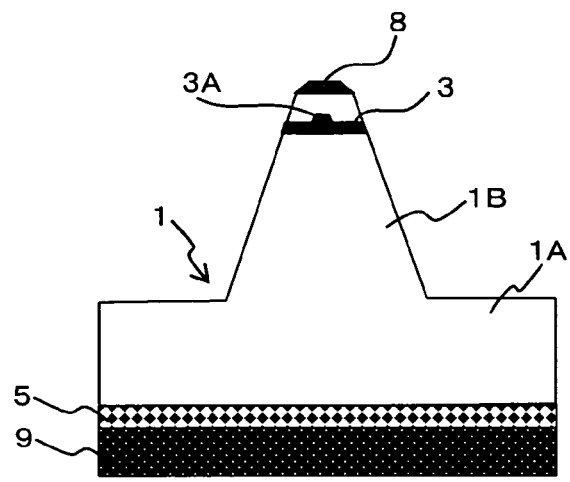
FIGS. 9(a)-9(d) show schematic cross-sectional views illustrating a position adjustment method of a quantum dot layer in a manufacturing method of a single-photon generating device, according to a second embodiment of the present invention.
Figure 9B:
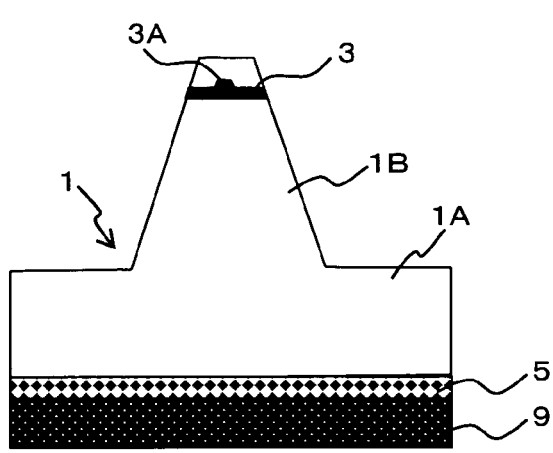

Namely, as exemplarily shown in FIG. 9(a), after protecting the surface of the AR film 5 by coating the photoresist 9 thereon, the SiO$_2$ mask 8 having protected the tip portion of the pillar portion 1B (pillar top portion) is removed by performing wet etching using, for example, a buffered hydrofluoric acid solution, as shown in FIG. 9(b).

Figure 9C:
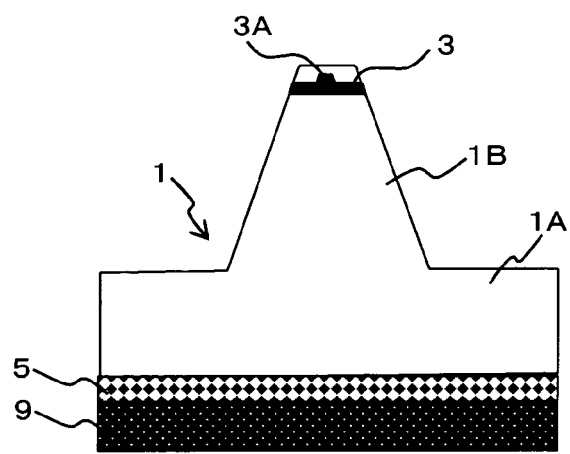

Thereafter, as shown in FIG. 9(c), by performing wet etching using, for example, a mixed liquid of a few percent of hydrobromide and hydrogen peroxide, the distance from the upper face of the pillar portion 1B to the quantum dot layer 3 is adjusted.

Figure 9D:
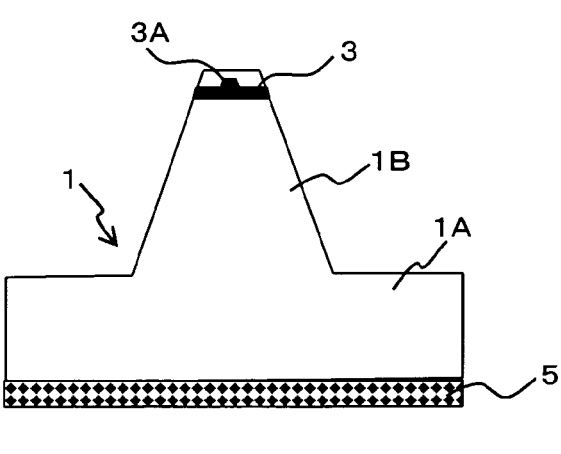

Then, as shown in FIG. 9(d), the photoresist 9 having protected the AR film 5 is removed using a removing liquid, and thus the optically pumped single-photon generating device is formed.

Other configurations are identical to the structures for the above first embodiment, and the descriptions thereof are omitted here.

Thus, according to the single-photon generating device in accordance with the present embodiment, similar to the aforementioned first embodiment, because the shape of the pillar portion 1B is devised so as to output light from the back face side of the substrate, there is a merit that the extraction efficiency of a single photon can be increased.

In particular, according to the device structure of the present single-photon generating device, in the single-photon generating device using the quantum dot 3A emitting light in a telecommunication band, there is a merit that the extraction efficiency of a single photon, and the coupling efficiency to an optical fiber as well, can be increased by a comparatively simple process without quality degradation.

Third Embodiment

Next, a single-photon generating device according to a third embodiment of the present invention will be described referring to FIGS. 10 and 11(a)-11(o).

As compared to the aforementioned first embodiment, the single-photon generating device according to the present embodiment differs in the point that the device of interest is a single-photon generating device of current injection type (for example, current-injection EL device). Namely, the single-photon generating device according to the present embodiment is a current-injection single-photon generating device using the light emitted from the quantum dot (quantum dot capable of emitting a single photon) in the semiconductor substrate.

Figure 10:
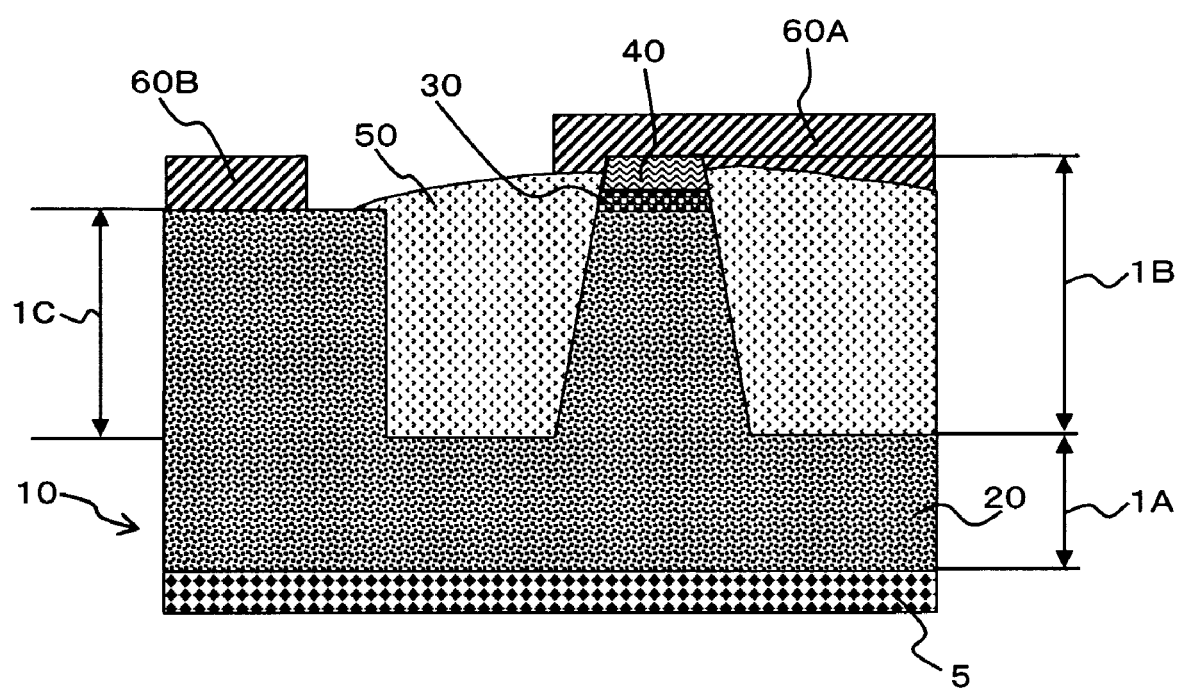
FIG. 10 shows a schematic diagram illustrating the structure of a single-photon generating device according to a third embodiment of the present invention.

According to the present embodiment, as shown in FIG. 10, a semiconductor substrate (solid substrate) 10 including an epitaxial growth layer formed of a semiconductor material of, for example, the GaAs system is used. As exemplarily shown in FIG. 10, the semiconductor 10 has a p-i-n structure, constituted of an i-InGaAsP layer 30, as quantum dot layer, and a p-GaAs layer 40, which are laminated on an n-GaAs substrate (including an n-GaAs layer) 20. In FIG. 10, like reference numerals are given to like parts described in the aforementioned first embodiment (refer to FIG. 1).

Also, similar to the aforementioned first embodiment, the semiconductor substrate 10 includes a base portion 1A, a pillar portion 1B being formed to protrude from the surface side of the base portion 1A, and an n-side extraction contact portion (contact area) 1C protruding from the surface of the base portion 1A. Further, the semiconductor substrate 10 is configured to have a quantum dot layer 3 in the vicinity of the tip of the pillar portion 1B.

Also, similar to the aforementioned first embodiment, the pillar portion 1B is configured to have a cross section on the base portion 1A side larger than the cross section on the tip side. In other words, the pillar portion 1B is configured such that the cross section thereof becomes gradually smaller as the cross section moves farther from the base portion 1A side toward the tip side. In this case, the side face of the pillar portion 1B becomes a slope face toward the inside of the pillar portion 1B.

Now, since the single-photon generating device according to the present embodiment is a current-injection single-photon generating device, a p-side extraction electrode 60A constituting an electrode for current injection (for example, a conductor film capable of functioning as electrode; metal film) is provided on the upper face (surface) of the pillar portion 1B. Further, an n-side extraction electrode 60B constituting an electrode for current injection (for example, a conductor film capable of functioning as electrode; metal film) is provided on the upper face (surface) of an n-side extraction contact portion 1C. Additionally, in FIG. 10, a reference numeral 50 represents an insulating resin layer (an buried layer).

Because the present device is configured such that light is extracted from the back face side, it is not necessary to dig a hole in the electrode, as was conventionally required. Also, because the metal electrode (conductor film) disposed on the surface side of the pillar portion 1B can be used as a reflection film, the extraction efficiency can be improved even in such the device having the electrode on the surface side.

Additionally, when the present device is configured as, for example, a voltage application-type EL device, it may well be possible to form a voltage application electrode (for example, a conductor film capable of functioning as electrode; metal film) on the surface side of the pillar portion 1B. In this case also, it is not necessary to dig a hole in the electrode, as was conventionally required. Also, because the metal electrode (conductor film) disposed on the surface side of the pillar portion 1B can be used as a reflection film, the extraction efficiency can be improved even in such the device having the electrode on the surface side.

Additionally, since other configurations are identical to those described in the aforementioned first embodiment, the descriptions are omitted here.

In the following, a manufacturing method of the single-photon generating device according to the present embodiment will be described referring to the schematic cross-sectional views shown in FIGS. 11(a)-11(o). Here, a current-injection single-photon generating device (for example, current-injection EL device) is exemplified.

In the present embodiment, there is described an exemplary case of using a semiconductor substrate 10 including an epitaxial growth layer of the GaAs-system and having a quantum dot layer 30 in the vicinity of the surface, using a $SiO_2$ mask as a pillar-forming mask 80, providing Ti/Pt/Au electrodes (conductor film; metal film) 60A, 60B capable of functioning as a reflection film, and forming a SiN film as an AR film 5.

Figure 11A:
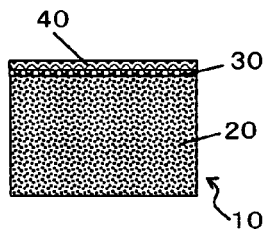
FIGS. 11(a)-11(o) show schematic cross-sectional views illustrating a manufacturing method of a single-photon generating device according to a third embodiment of the present invention.
Figure 11B:
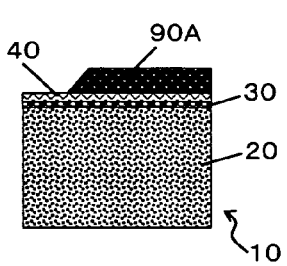

First, on the substrate 10 as shown in FIG. 11(a), a photoresist is coated to a thickness of, for example, approximately 2,000 nm. Then, using a contact exposure apparatus, patterning is performed using a pattern for forming an n-side extraction contact area, so that a mask (resist mask) 90A for forming the n-side extraction contact area is formed, as shown in FIG. 11(b).

Figure 11C:
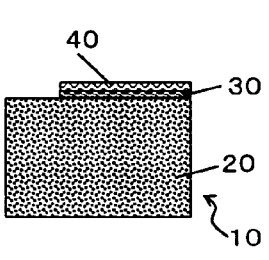

Next, as shown in FIG. 11(c), a p-GaAs layer 40 is removed by wet etching using, for example, a hydrobromide solution, and also the i-InGaAsP layer (quantum dot layer) 30 is removed by wet etching using, for example, a mixed liquid of a few percent of sulfuric acid and hydrogen peroxide, so that an area to be the n-side extraction contact portion is secured.

Figure 11D:
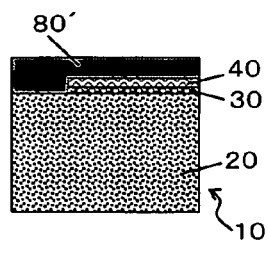

Subsequently, as shown in FIG. 11(d), a $SiO_2$ film 80' is formed on the semiconductor substrate 10 having the quantum dot layer 30 in the vicinity of the surface, by growing $SiO_2$ as pillar-forming mask material to a thickness of, for example, 1,000 nm. Here, the above process is performed under the conditions of, for example, a substrate temperature of approximately 300° C., and a pressure of approximately 0.15 Torr, using an LP-CVD apparatus in which, for example, monosilane and oxygen are used as reaction gases.

Figure 11E:
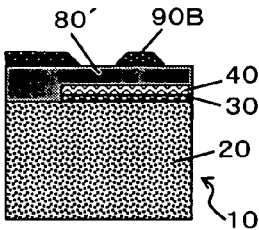

Subsequently, as shown in FIG. 11(e), a photoresist is coated on the $SiO_2$ film 80' to a thickness of, for example, approximately 2,000 nm. Then, a resist mask 90B having both the pattern of a frustum shape of circular cone with a diameter of, for example, approximately 6,000 nm and the pattern for forming the n-side extraction contact portion is formed, using the contact exposure apparatus.

Figure 11F:
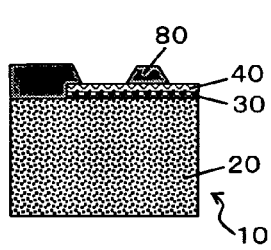

Next, using the above resist mask 90B, by performing wet etching using, for example, a buffered hydrofluoric acid solution, the mask pattern is transferred to the $SiO_2$ film 80'. Thus, as shown in FIG. 11(f), a $SiO_2$ mask 80 having a diameter of, for example, approximately 4,000 nm, which functions as the pillar-forming mask and the mask for forming the n-side extraction contact area, is formed. Thereafter, the resist mask 90B remaining on the $SiO_2$ mask 80 is removed using a removing liquid.

Figure 11G:
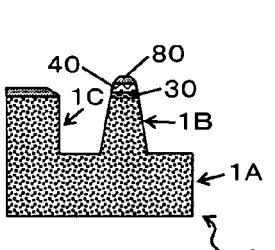

Next, using the $SiO_2$ mask 80 thus formed, by an ICP dry etching apparatus using, for example, tetrachlorosilane and argon as reaction gases, there are formed a pillar portion 1B, having a height of, for example, approximately 10,000 nm and having the quantum dot layer 30 existent in the vicinity of the tip, and the n-side extraction contact portion 1C, as shown in FIG. 11(g). The above process is performed under the conditions of, for example, a substrate temperature of approximately 200° C., and a pressure of 0.5 Torr. Here, after the above etching, the portion remaining on the lower side of the pillar portion 1B and the n-side extraction contact portion 1C becomes the base portion 1A. In other words, the pillar portion 1B and the n-side extraction contact portion 1C are formed on the surface side of the base portion 1A.

As such, as a processing process of the surface side of the substrate, dry etching is performed onto the semiconductor substrate 10 having the quantum dot 30 existent in the vicinity of the surface. Thus, the pillar portion 1B is formed to have the cross section on the base portion 1A side larger than the cross section on the tip side, as shown in FIG. 11(g), so that the light generated from the quantum dot included in the quantum dot layer 30 is reflected on the surface (upper face and side face) of the pillar portion 1B, propagated inside the pillar portion 1B, and output from the back face side of the base portion 1A.

Additionally, here, in order to form the pillar portion 1B, only the dry etching under one condition is performed. However, the method for forming the pillar portion 1B is not limited thereto. For example, it may also be possible to perform wet etching only. Also, to enable angle adjustment of the side face (slope face) of the pillar portion, and to aim to reduce an etching damage, it may be possible to use, for example, a combination of wet etching and dry etching, as described in the second embodiment.

Figure 11H:
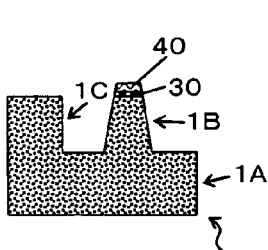

Subsequently, as shown in FIG. 11(h), the $SiO_2$ mask 80 formed on both the pillar portion 1B and the n-side extraction contact portion 1C is removed by performing wet etching using, for example, a buffered hydrofluoric acid solution.

Figure 11I:
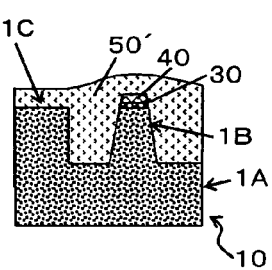

Next, shown in FIG. 11(i), to flatten the surface and protect the pillar portion, an insulating material (insulating resin material) 50' is coated on the semiconductor substrate 10 having the pillar portion 1B and the n-side extraction contact portion 1C formed thereupon so that the pillar portion 1B is buried.

Figure 11J:
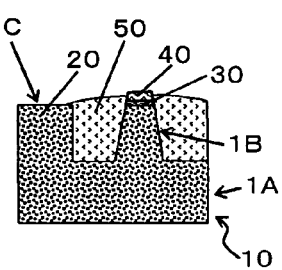

Subsequently, the above insulating material 50' is cured under the condition of a curing temperature of, for example, 200° C. [as a result, an insulating layer (insulating resin layer) 50 is formed]. Thereafter, as shown in FIG. 11(j), the surfaces of both the pillar portion 1B and the n-side extraction contact portion 1C are disclosed using an RIE dry etching apparatus in which, for example, a $CF_4$ gas and oxygen are used as a reaction gas, under the condition of a pressure of, for example, approximately 20 Torr. Namely, dry etching is performed so that both the p-GaAs layer 40 constituting the tip of the pillar portion 1B (pillar top portion) and the n-GaAs layer 20 constituting the n-side extraction contact portion 1C are exposed to the surface.

Figure 11K:
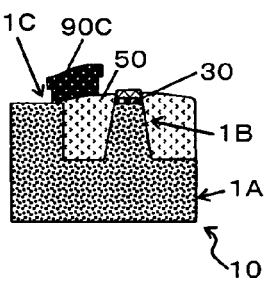

Next, a photoresist 90C is coated on the above exposed portions to a thickness of, for example, approximately 2,000 nm. Then, as shown in FIG. 11(k), a pattern for forming the n-side extraction electrode 60B and the p-side extraction electrode 60A is patterned using a contact exposure apparatus.

Figure 11L:
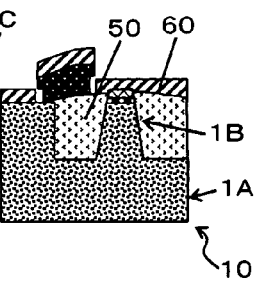
Figure 11M:
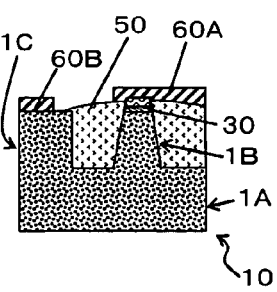

Next, as shown in FIG. 11(l), using an EB evaporation apparatus, a metal film (conductor film) 60 constituted of, for example, Ti/Pt/Au (50/50/200 nm) is evaporated. Then, by lifting off through the boiling process using an organic solvent, the p-side extraction electrode 60A and the n-side extraction electrode 60B are formed simultaneously, as shown in FIG. 11(m).

Figure 11N:
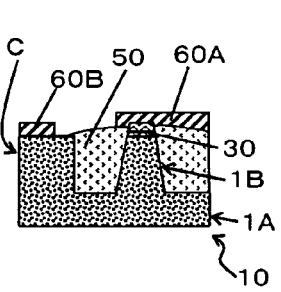

Thereafter, as shown in FIG. 11(n), the mirror finishing is performed by polishing the back face of the substrate (the back face of the base portion 1A), for example, as thick as approximately 150,000 nm.

Figure 11O:
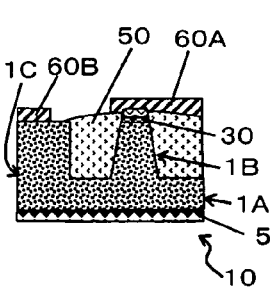

Next, as shown in FIG. 11(o), SiN, a material for forming the AR film 5, is grown to a thickness of, for example, approximately 200 nm, using a plasma CVD apparatus in which, for example, monosilane, ammonia and nitrogen are used as reaction gases. The above process is performed under the conditions of, for example, a substrate temperature of approximately 250° C., and a pressure of approximately 1 Torr. Thus, a SiN film functioning as AR film 5 is formed.

In such a way, the current-injection single-photon generating device is formed.

Thus, according to the single-photon generating device in accordance with the present embodiment, similar to the aforementioned first embodiment, because the shape of the pillar portion 1B is devised so as to output light from the back face side of the substrate, there is a merit that the extraction efficiency of a single photon can be increased.

In particular, according to the device structure of the present single-photon generating device, in the single-photon generating device using the quantum dot emitting light in a communication wavelength band, there is a merit that the extraction efficiency of a single photon, and the coupling efficiency to an optical fiber as well, can be increased by a comparatively simple process without quality degradation.

OTHERS

Additionally, the single-photon generating device according to each the aforementioned embodiment is quite effective to improve the efficiency of the single-photon generating device using a quantum dot emitting light at a telecommunication band. However, the applications of the present invention are not limited to the application to such the single-photon generating device using the quantum dot. For example, the present invention is widely applicable to a single-photon generating device using light emission from a localized level existent in the vicinity of the surface of a solid substrate, such as a single-photon generating device using a defect or a color center in a solid body. In order to extract the light, being emitted from the localized level existent in the vicinity of the surface of the solid substrate, from the back face side, the pillar portion as described in each aforementioned embodiment is well formed by processing the surface side of the solid substrate in which the localized level exists.

Also, according to each the aforementioned embodiment, the description has been made for the single-photon generating device obtained by applying the present invention. However, the present invention may also be applied to a single-photon detecting device (photodetector) and an optical quantum gate. More specifically, since a light absorption process and a light radiation process are entirely reverse processes, by applying the structure of the present invention (particularly, the shape of the pillar portion) to the single-photon detecting device and the optical quantum gate, light incident from the back face of the substrate can also be absorbed (interact) efficiently in a quantum dot.

In the above case, the single-photon detecting device or the optical quantum gate is configured as having a semiconductor substrate (solid substrate) including a base portion and a pillar portion formed on the surface side of the base portion. Further, the pillar portion is formed to have a larger cross section on the base portion side than the cross section on the tip portion side so as to enable absorption of the light, which is incident from the back face side of the base portion, propagated inside the pillar portion and reflected on the surface of the pillar portion, by the quantum dot existent in the vicinity of the tip (localized level; for example, exciton level). Additionally, more specific structure such as the shape of the pillar portion may be configured in a similar manner to the structure of each embodiment described above.

According to the single-photon detecting device and the optical quantum gate of the present invention with such the structure as described above, the detection efficiency of a single photon can be increased.

It is to be noted that the scope of the present invention is not limited to the foregoing description of the preferred embodiments. A variety of modifications may be possible without departing from the scope of the invention.

What is claimed is:

1. A single-photon generating device comprising a solid substrate having a base portion and a pillar portion, said pillar portion being formed on the surface side of the base portion and having a localized level existent in the vicinity of the tip thereof, wherein
    the pillar portion is formed to have a larger cross section on the base portion side than the cross section on the tip side, so that the light generated from the localized level is reflected on the surface, propagated internally, and output from the back face side of the base portion,
    the pillar portion has a base angle in the range of 65 to 85 degrees, the base angle being formed between the pillar portion and the base portion,
    the pillar portion has a height from the surface of the base portion, the height being at least 10 times a light wavelength propagating in the solid substrate, and
    the entire pillar portion except a portion in which the localized level exists is made of a single semiconductor material.

2. The single-photon generating device according to claim 1,
    wherein the pillar portion is formed by dry etching and wet etching on the solid substrate having the localized level existent in the vicinity of the surface.

3. The single-photon generating device according to claim 1, wherein the pillar portion is formed to have a shape identical or close to a shape of a rotational symmetric body.

4. The single-photon generating device according to claim 1,
wherein an anti-reflection film is provided on the back face side of the base portion.

5. The single-photon generating device according to claim 1,
wherein a convex lens or a Fresnel lens is provided on the back face side of the base portion.

6. The single-photon generating device according to claim 1, further including a reflection film being formed to cover either the entire or a portion of the surface of the pillar portion, enabling reflection of the light generated from the localized level.

7. The single-photon generating device according to claim 1,
wherein the reflection film is constituted of either metal film, dielectric film and metal film, dielectric multilayer film, dielectric multilayer film and metal film, or semiconductor multilayer film.

8. The single-photon generating device according to claim 1, further including a surface protection film enabling protection of the surface of the pillar portion.

9. The single-photon generating device according to claim 1,
wherein the pillar portion includes a resonator structure constituted of a semiconductor multilayer film, being formed on the upper and lower sides of a portion having the existent localized level.

10. The single-photon generating device according to claim 1,
wherein a current injection electrode or a voltage application electrode is provided on the surface side of the pillar portion.

11. The single-photon generating device according to claim 10,
wherein the electrode is capable of functioning as reflection film enabling reflection of the light generated from the localized level.

12. The single-photon generating device according to claim 1,
wherein the localized level is an exciton level.

13. A single-photon detecting device comprising a solid substrate having a base portion and a pillar portion being formed on the surface side of the base portion,
wherein the pillar portion is formed to have a larger cross section on the base portion side than the cross section on the tip side, so that the light being incident from the back face side of the base portion, propagated internally, and reflected on the surface of the pillar portion can be absorbed at the localized level existent in the vicinity of the tip,
the pillar portion has a base angle in the range of 65 to 85 degrees, the base angle being formed between the pillar portion and the base portion,
the pillar portion has a height from the surface of the base portion the height being at least 10 times a light wavelength propagating in the solid substrate, and
the entire pillar portion except a portion in which the localized level exists is made of a single semiconductor material.

14. The single-photon detecting device according to claim 13,
wherein the localized level is an exciton level.

15. An optical quantum gate comprising a solid substrate having a base portion and a pillar portion being formed on the surface side of the base portion,
wherein the pillar portion is formed to have a larger cross section on the base portion side than the cross section on the tip side, so that the light being incident from the back face side of the base portion, propagated inside the pillar portion, and reflected on to surface of the pillar portion can interact to the localized level existent in the vicinity of the tip,
the pillar portion has a base angle in the range of 65 to 85 degrees, the base angle being formed between the pillar portion and the base portion,
the pillar portion has a height from the surface of the base portion, the height being at least 10 times a light wavelength propagating in the solid substrate, and
the entire pillar portion except a portion in which the localized level exists is made of single semiconductor material.

16. The optical quantum gate according to claim 15,
wherein the localized level is an exciton level.

* * * * *